(12) United States Patent
Chen et al.

(10) Patent No.: US 11,869,828 B2
(45) Date of Patent: Jan. 9, 2024

(54) SEMICONDUCTOR PACKAGE THROUGH HOLE WITH LEVER ARMS AND INSULATING LAYERS WITH DIFFERENT COEFFICIENT OF THERMAL EXPANSION

(71) Applicant: Advanced Semiconductor Engineering, Inc., Kaohsiung (TW)

(72) Inventors: Yi-Chi Chen, Kaohsiung (TW); Ming-Han Wang, Kaohsiung (TW)

(73) Assignee: ADVANCED SEMICONDUCTOR ENGINEERING, INC., Kaohsiung (TW)

(*) Notice: Subject to any disclaimer, the term of this patent is extended or adjusted under 35 U.S.C. 154(b) by 134 days.

(21) Appl. No.: 17/344,842

(22) Filed: Jun. 10, 2021

(65) Prior Publication Data

US 2022/0399250 A1   Dec. 15, 2022

(51) Int. Cl.
| | | |
|---|---|---|
| *H01L 23/48* | (2006.01) | |
| *H01L 23/00* | (2006.01) | |
| *H01L 27/146* | (2006.01) | |
| *H01L 21/768* | (2006.01) | |

(52) U.S. Cl.
CPC .......... *H01L 23/481* (2013.01); *H01L 23/562* (2013.01); *H01L 27/14634* (2013.01)

(58) Field of Classification Search
CPC ................. H01L 23/481; H01L 23/562; H01L 27/14634; H01L 21/76898
See application file for complete search history.

(56) References Cited

U.S. PATENT DOCUMENTS

| | | | | |
|---|---|---|---|---|
| 6,809,421 | B1* | 10/2004 | Hayasaka | ............... H01L 25/50 257/621 |
| 10,197,730 | B1* | 2/2019 | Ngu | ................... G02B 6/12002 |
| 2004/0137701 | A1* | 7/2004 | Takao | ................. H01L 23/3114 257/E23.021 |
| 2012/0228778 | A1* | 9/2012 | Kosenko | ................ H05K 1/115 438/668 |
| 2013/0307155 | A1* | 11/2013 | Mitsuhashi | ....... H01L 21/76898 257/761 |
| 2018/0122749 | A1* | 5/2018 | Lee | ....................... H01L 21/486 |
| 2020/0273844 | A1 | 8/2020 | Hirano et al. | |
| 2021/0033785 | A1 | 2/2021 | Wu et al. | |

\* cited by examiner

*Primary Examiner* — Herve-Louis Y Assouman
(74) *Attorney, Agent, or Firm* — FOLEY & LARDNER LLP (57) ABSTRACT

A semiconductor package includes a first die. The first die includes a semiconductor substrate. The semiconductor substrate has a first surface, a second surface opposite to the first surface, and a through hole between the first surface and the second surface and having an inner wall. The inner wall has a first lever arm. A length of the first lever arm is less than a thickness of the semiconductor substrate.

17 Claims, 12 Drawing Sheets

SEMICONDUCTOR PACKAGE THROUGH HOLE WITH LEVER ARMS AND INSULATING LAYERS WITH DIFFERENT COEFFICIENT OF THERMAL EXPANSION

BACKGROUND

1. Field of the Disclosure

The present disclosure relates to a semiconductor package and a manufacturing method thereof, and to a semiconductor package including a die having a through hole, and a method for manufacturing the semiconductor package.

2. Description of the Related Art

In a silicon photonic device, an electronic integrated circuit may be electrically connected to a substrate through a through silicon via (TSV) of a photonic integrated circuit. Due to CTE mismatch between materials of different layers of the TSV, cracks may occur during temperature and humidity test.

SUMMARY

In some embodiments, a semiconductor package includes a first die. The first die includes a semiconductor substrate. The semiconductor substrate has a first surface, a second surface opposite to the first surface, and a through hole between the first surface and the second surface and having an inner wall. The inner wall has a first lever arm. A length of the first lever arm is less than a thickness of the semiconductor substrate.

In some embodiments, a semiconductor package includes a first die. The first die includes a semiconductor substrate. The semiconductor substrate has a first surface, a second surface opposite to the first surface, and a through hole between the first surface and the second surface. The semiconductor substrate has at least one first stress raiser located between the first surface and the second surface of semiconductor substrate.

BRIEF DESCRIPTION OF THE DRAWINGS

Aspects of some embodiments of the present disclosure are readily understood from the following detailed description when read with the accompanying figures. It is noted that various structures may not be drawn to scale, and dimensions of the various structures may be arbitrarily increased or reduced for clarity of discussion.

DETAILED DESCRIPTION

Common reference numerals are used throughout the drawings and the detailed description to indicate the same or similar components. Embodiments of the present disclosure will be readily understood from the following detailed description taken in conjunction with the accompanying drawings.

The following disclosure provides for many different embodiments, or examples, for implementing different features of the provided subject matter. Specific examples of components and arrangements are described below to explain certain aspects of the present disclosure. These are, of course, merely examples and are not intended to be limiting. For example, the formation of a first feature over or on a second feature in the description that follows may include embodiments in which the first and second features are formed or disposed in direct contact, and may also include embodiments in which additional features may be formed or disposed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

In a comparative example, a semiconductor package structure may include a semiconductor die, a circuit structure and a TSV The semiconductor die has a first surface, a second surface opposite to the first surface, and an inner wall defining a through hole. The circuit structure includes an insulation layer disposed on the first surface and covering the through hole. The TSV is disposed in the through hole and contacts the insulation layer of the circuit structure.

In the aforementioned semiconductor package structure, interfaces are formed between any two of the semiconductor die, the TSV and the insulation layer of the circuit structure. Due to CTE differences between the semiconductor die, the TSV and the insulation layer of the circuit structure, when environmental temperature changes, stress may occur at the interfaces.

For example, presuming that the CTE of the TSV is greater than the CTE of the semiconductor die and the insulation layer, when environmental temperature increase, The TSV may expand and press the semiconductor die and the insulation layer. Since the inner wall of the semiconductor die is generally straight and continuous, the inner wall may serve as a lever arm for a pressing force occurred at an end of the through hole distal to the insulation layer.

The lever arm (the inner wall of the semiconductor die) is continuous and is connected to the other end of the through hole (i.e., at the junction between the semiconductor die, the TSV and the insulation layer of the circuit structure). Accordingly, the pressing force may result in moment of force at the junction, thus cracks may easily occur at the junction. A longer lever arm may worsen the crack situation.

In another aspect, since the inner wall of the semiconductor die is generally straight and continuous, there is not stress raiser located between the two ends of through hole. Accordingly, the stress may concentrate at the two ends of the through hole, which results in cracks at the junction between the semiconductor die, the TSV and the insulation layer of the circuit structure.

Hence, at least some embodiments of the present disclosure provide for a semiconductor package structure, which is able to eliminate or avoid the aforementioned cracks at the junction between the semiconductor die, the TSV and the insulation layer of the circuit structure.

Figure 1:
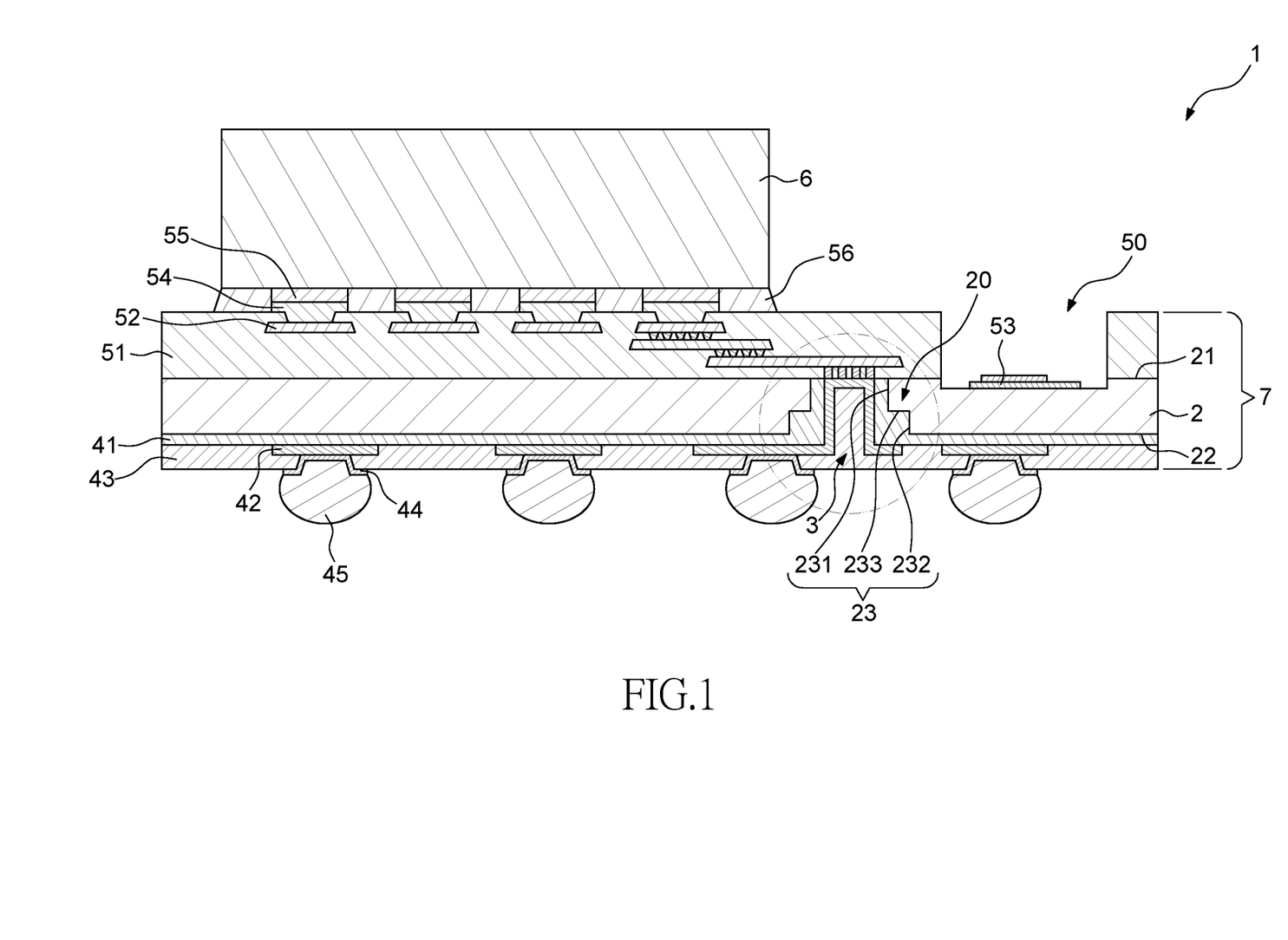
FIG. 1 illustrates a cross sectional view of a semiconductor package according to some embodiments of the present disclosure.
Figure 2:
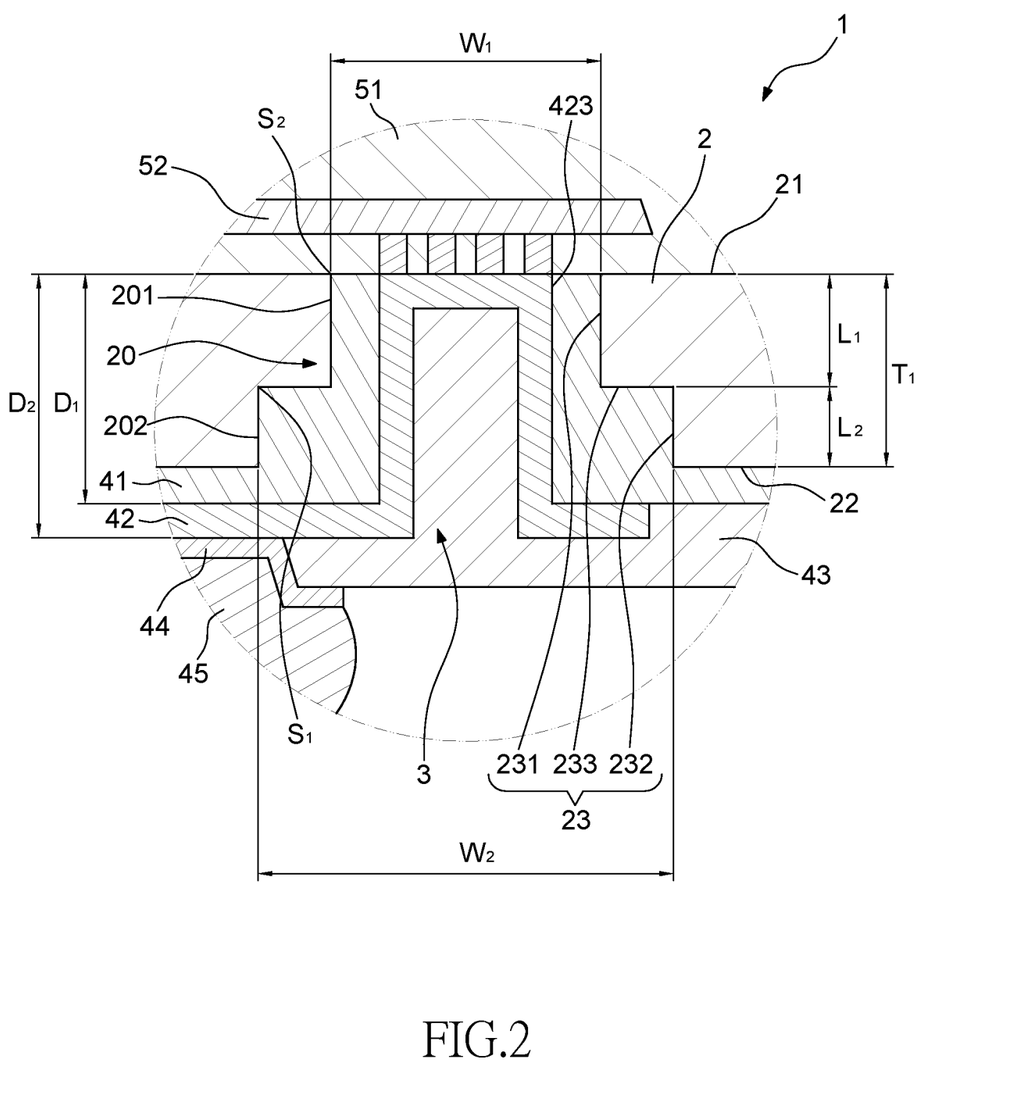
FIG. 2 illustrates an enlarged view of the semiconductor package shown in FIG. 1.

FIG. 1 illustrates a cross sectional view of a semiconductor package 1 according to some embodiments of the present disclosure. FIG. 2 illustrates an enlarged view of the semiconductor package 1. Referring to FIG. 1 and FIG. 2, the semiconductor package 1 includes a first die 7, a second dielectric layer 43, an under bump metallization (UBM) 44, an external connector 45, a second die 6, a conductive bump 55, a solder 54 and an underfill 56.

The first die 7 includes a semiconductor substrate 2, a through via 3, a first dielectric layer 41, a conductive layer such as a first conductive layer 42, and a circuit structure (e.g., including an insulation layer 51 and a circuit layer 52). In some embodiments, the first die 7 may be a semiconductor die. For example, the first die 7 may be a photonic integrated circuit. The semiconductor substrate 2 has a first surface 21, a second surface 22 opposite to the first surface 21, and a through hole 20 between the first surface 21 and the second surface 22 and having an inner wall 23. In other words, the semiconductor substrate 2 has the inner wall 23 extending between the first surface 21 and the second surface 22, and the inner wall 23 defines the through hole 20. The through hole 20 may serve for accommodating the through via 3. The semiconductor substrate 2 has a thickness $T_1$. For example, as shown in FIG. 2, the thickness $T_1$ is defined as a distance between the first surface 21 and the second surface 22. In some embodiments, a material of the semiconductor substrate 2 includes silicon. In some embodiments, the semiconductor substrate 2 may include, or be composed of, a homogenous material. The homogenous material includes an interface-less material. The through hole 20 may extend through the homogenous material of the semiconductor substrate 2.

As shown in FIG. 1, the inner wall 23 of the semiconductor substrate 2 is in a stair shape. The inner wall 23 of the semiconductor substrate 2 has a first portion 231, a second portion 232 and a third portion 233. The first portion 231, the second portion 232 and the third portion 233 are located between the first surface 21 and the second surface 22 of the semiconductor substrate 2. The first portion 231, the second portion 232 and the third portion 233 are not coplanar. The first portion 231, the second portion 232 and the third portion 233 are not continuous with each other. The first portion 231 is closer to the first surface 21 than the second portion 232 is. For example, the first portion 231 is connected to the first surface 21, and the second portion 232 is connected to the second surface 22. The third portion 233 is connected between the first portion 231 and the second portion 232. The first portion 231, the second portion 232 and the third portion 233 are collectively in a stair shape. In some embodiments, the first portion 231, the second portion 232 and the third portion 233 collectively forms a stair shape.

The first portion 231 and the second portion 232 of the inner wall 23 are angled with respect to the first surface 21 of the semiconductor substrate 2. Specifically, as shown in FIGS. 1 and 2, the first portion 231 of the inner wall 23 is substantially perpendicular to the first surface 21 of the semiconductor substrate 2.

The through via 3 is disposed in the through hole 20 of the semiconductor substrate 2 for electrical connection purpose. Specifically, the through via 3 electrically connects components disposed on the first surface 21 of the semiconductor substrate 2 (e.g., the circuit structure) and components disposed on the second surface 22 of the semiconductor substrate 2 (e.g., the first conductive layer 42). In some embodiments, the through via 3 is electrically non-connected from the semiconductor substrate 2. For example, the through via 3 may be electrically insulated from the semiconductor substrate 2 to avoid leakage current to the semiconductor substrate 2 which may result in short circuit with circuits in the first die 2. The through via 3 may be a TSV.

The first dielectric layer 41, the first conductive layer 42 and the second dielectric layer 43 are sequentially disposed adjacent to the second surface 22 of the semiconductor substrate 2. As shown in FIG. 1, the first dielectric layer 41 may be disposed on the second surface 22 of the semiconductor substrate 2. The first conductive layer 42 may be disposed on the first dielectric layer 41. The second dielectric layer 43 may be disposed on and cover the first dielectric layer 41 and the first conductive layer 42. A material of the first dielectric layer 41 and/or the second dielectric layer 43 may include an epoxy-based photoresist, polyimide or other materials having a low dielectric constant. A material of the first conductive layer 42 may include copper, and may be formed by electroplating. In some embodiments, a seed layer such as a titanium layer may be formed by physical vapor deposition (PVD) for electroplating the first conductive layer 42. In other embodiments, the conductive layer 42 may be formed by electroless plating, thus a seed layer may be omitted.

A portion of the first dielectric layer 41, a portion of the first conductive layer 42 and a portion of the second dielectric layer 43 extend into the through hole 20 of the semiconductor substrate 2 to form the through via 3. The portion of the first dielectric layer 41 is disposed between the portion of the first conductive layer 42 and the inner wall 23 of the semiconductor substrate 2, and the portion of the second dielectric layer 43 is disposed on and covers the portion of the first conductive layer 42.

The UBM 44 and the external connector 45 are disposed adjacent to the second surface 22 of the semiconductor substrate 2 and electrically connected to the first conductive layer 42. The external connector 45 may serve for external connection purpose.

The circuit structure may include an insulation layer 51 and a circuit layer 52. In some embodiments, the circuit structure may include a plurality of insulation layers and a plurality of circuit layers. The circuit structure is disposed on the first surface 21 of the semiconductor substrate 2, and covers the through hole 20 of the semiconductor substrate 2. For example, the insulation layer 51 contacts the first surface 21 of the semiconductor substrate 2 and covers the through hole 20 of the semiconductor substrate 2. The circuit structure (e.g., the circuit layer 52) is electrically connected to the through via 3, and is electrically connected to the first conductive layer 42 through the through via 3.

The insulation layer 51 may define a trench 50 for positioning an optical component. The optical component may include a light emitting component such as a laser source, or a light receiving component such as an optical fiber or a fiber array unit (FAU). For example, a medium layer 53 may be disposed in the trench 50. In some embodiments, the medium layer 53 may be an adhesive for adhering the optical fiber or FAU. In other embodiments, the medium layer 53 may be a pad for electrically connecting an electrode of the laser source. A material of the insulation layer 51 may include silicon oxide. In some embodiments, the material of the insulation layer 51 is different from a material of the through via 3. Specifically, the material of the insulation layer 51 is different from the material of the first dielectric layer 41. In some embodiments, a coefficient of thermal expansion (CTE) of the insulation layer 51, a CTE of the semiconductor substrate 2 and a CTE of the first dielectric layer 41 are different from each other. For example, the CTE of the insulation layer 51 is less than the CTE of the semiconductor substrate 2, and the CTE of the semiconductor substrate 2 is less than the CTE of the dielectric layer 41.

The second die 6 is disposed adjacent to the first surface 21 of the semiconductor substrate 2, and the second 6 die is electrically connected to the through via 3. The second die 6 may be a semiconductor die, such as an electronic integrated circuit. For example, the conductive bump 55 and the solder 54 are sequentially disposed on the circuit layer 52 of the circuit structure. The second die 6 contacts the solder 54, and is electrically connected to the through via 3 through the conductive bump 55, the solder 54 and the circuit layer 52 of the circuit structure. The underfill 56 is disposed between the second die 6 and the circuit structure, and covers and surrounds the conductive bump 55 and the solder 54.

Referring to FIG. 2, the inner wall 23 of the semiconductor substrate 2 has a first lever arm 201. In some embodiments, the first lever arm 201 refers to a portion (e.g., the first portion 231) of the inner wall 23 which is continuous and connected to a junction between the semiconductor substrate 2, the first dielectric layer 41 and the circuit structure (e.g., the insulation layer 51). In some embodiments, the first lever arm 201 may be the first portion 231, and may be defined along an extending direction of the through hole 20. A length $L_1$ of the first lever arm 201 is less than the thickness $T_1$ of the semiconductor substrate 2.

In some embodiments, the inner wall 23 further has a second lever arm 202. The second lever arm 202 refers to another portion (e.g., the second portion 232) of the inner wall 23 which is continuous, is misaligned with the first lever arm 201. The second lever arm 202 and the first lever arm 201 are physically distinct from each other. Similar to the first lever arm 201, the second lever arm 202 may be the second portion 232, and may be defined along an extending direction of the through hole 20. A length $L_2$ of the second lever arm 202 is less than the length $L_1$ of the first lever arm 201. A depth $L_2$ of the second portion 232 of the inner wall 23 is less than a depth $L_1$ of the first portion 231 of the inner wall 23. However, in other embodiments, the length $L_2$ of the second lever arm 202 may be equal to or greater than the length $L_1$ of the first lever arm 201. In some embodiments, a ratio of a length $L_2$ of the second lever arm 202 to the length $L_1$ of the first lever arm is in a range of 1:2 to 2:1. In some embodiments, a width $W_2$ of the second portion 232 of the inner wall 23 is greater than a width $W_1$ of the first portion 231 of the inner wall 23.

In another aspect, the semiconductor substrate 2 has at least one first stress raiser $S_1$ located between the first surface 21 and the second surface 22 of semiconductor substrate 2. The term "stress raiser" refers to a sharp corner, groove, notch or acute change of section that cause stress concentration. As shown in FIG. 1, the first stress raiser $S_1$ is located at a concave edge of the inner wall 23, such as a junction between the second portion 232 and the third portion 233 of the inner wall 23.

In addition, the semiconductor substrate 2 further has a second stress raiser $S_2$ located at a junction of the inner wall 23 (e.g., the first portion 231 of the inner wall 23) and the circuit structure (e.g., the insulation layer 51).

As shown in FIG. 2, the portion of the first dielectric layer 41 in the through hole 20 has a depth $D_1$. The depth $D_1$ may be defined as a distance between a bottommost point and a topmost point of the portion of the first dielectric layer 41. The depth $D_1$ of the portion of the first dielectric layer 41 is greater than the length $L_1$ of the first lever arm 201.

The portion of the first conductive layer 42 in the through hole 20 has a depth $D_2$. The depth $D_2$ may be defined as a distance between a bottommost point and a topmost point of the portion of the first conductive layer 42. The depth $D_2$ of the portion of the first conductive layer 42 is greater than the length of the first lever arm 201.

The portion of the first conductive layer 42 has a peripheral wall 423. The peripheral wall 423 of the portion of the first conductive layer 42 is substantially continuous. In some embodiments, the peripheral wall 423 may be substantially straight.

As mentioned previously, when environmental temperature increases, moment of force may occur at the junction between the semiconductor substrate 2, the through via 3 and the insulation layer 51 of the circuit structure (i.e., the second stress raiser $S_2$). While not willing to be bound by any theory, it is believed that in the semiconductor package 1, since the length $L_1$ of the first lever arm 201 is less than the thickness $T_1$ of the semiconductor substrate 2, the lever arm (e.g., the first lever arm 201) is shortened. Accordingly, moment of force at the second stress raiser $S_2$ may be reduced. In another aspect, as mentioned previously, stress tends to concentrate at two ends of the through hole 21, such as the junction between the semiconductor substrate 2, the through via 3 and the insulation layer 51 of the circuit structure (i.e., the second stress raiser $S_2$). Due to the arrangement of the first raiser $S_1$ in the semiconductor package 1, a portion of stress may be concentrated at the first stress raiser $S_1$ rather than the second stress raiser $S_2$. Hence, the stress concentrated at the second stress raiser $S_2$ can be reduced. Cracks at the junction may thus be eliminated or avoided.

Table 1 below shows simulation results of stress at the second stress raiser $S_2$ in the semiconductor package 1, performed in ANSYS_APDL. The simulation results indicate that the semiconductor packages structure 1 can sufficiently reduce the stress at the second stress raiser $S_2$.

TABLE 1

|   | $L_1$ (μm) | $L_2$ (μm) | $L_1/L_2$ | Stress at $S_2$ (MPa) |
| --- | --- | --- | --- | --- |
| 1 | 10 | 65 | 0.154 | 42 |
| 2 | 15 | 60 | 0.25 | 65 |
| 3 | 20 | 55 | 0.364 | 83 |
| 4 | 25 | 50 | 0.5 | 92 |
| 5 | 30 | 45 | 0.667 | 107 |
| 6 | 35 | 40 | 0.875 | 123 |

TABLE 1-continued

| | $L_1$ (µm) | $L_2$ (µm) | $L_1/L_2$ | Stress at $S_2$ (MPa) |
|---|---|---|---|---|
| 7 | 40 | 35 | 1.143 | 137 |
| 8 | 45 | 30 | 1.5 | 146 |
| 9 | 50 | 25 | 2 | 158 |
| 10 | 55 | 20 | 2.75 | 169 |
| 11 | 60 | 15 | 4 | 180 |
| Comparative | 75 | 0 | N.A. | 214 |

Figure 3:
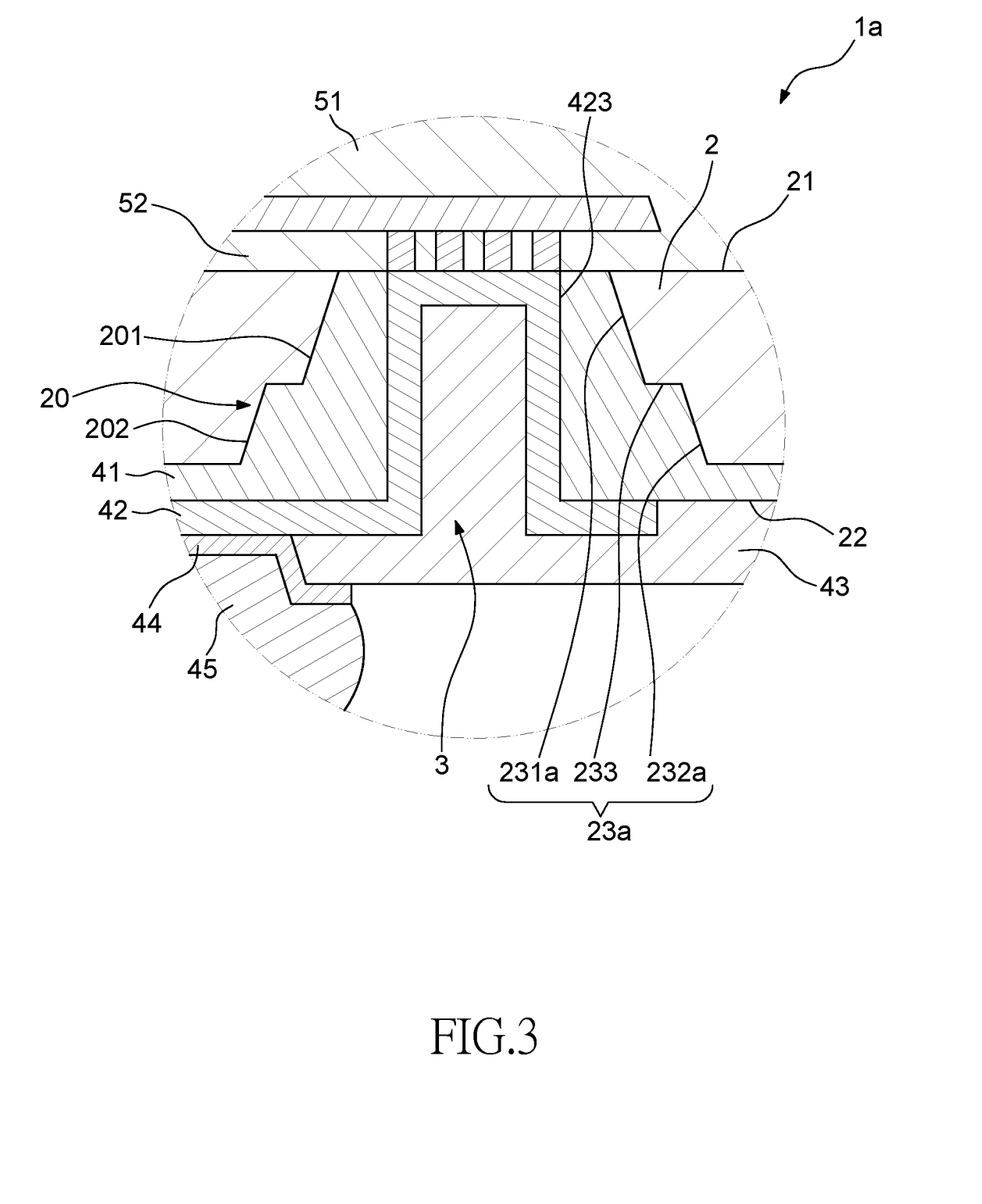
FIG. 3 illustrates an enlarged, cross sectional view of a semiconductor package according to some embodiments of the present disclosure.

FIG. 3 illustrates an enlarged, cross section view of a semiconductor package 1a according to some embodiments of the present disclosure. The semiconductor package 1a is similar to the semiconductor package 1 shown in FIG. 1, except that the first portion 231a and the second portion 232a of the inner wall 23a are not perpendicular to the first surface 21 and the second surface 22 of the semiconductor substrate 2. In other words, an angle between the first portion 231a of the inner wall 23a and the first surface 21 of the semiconductor substrate 2 is less than 90 degrees.

Figure 4:
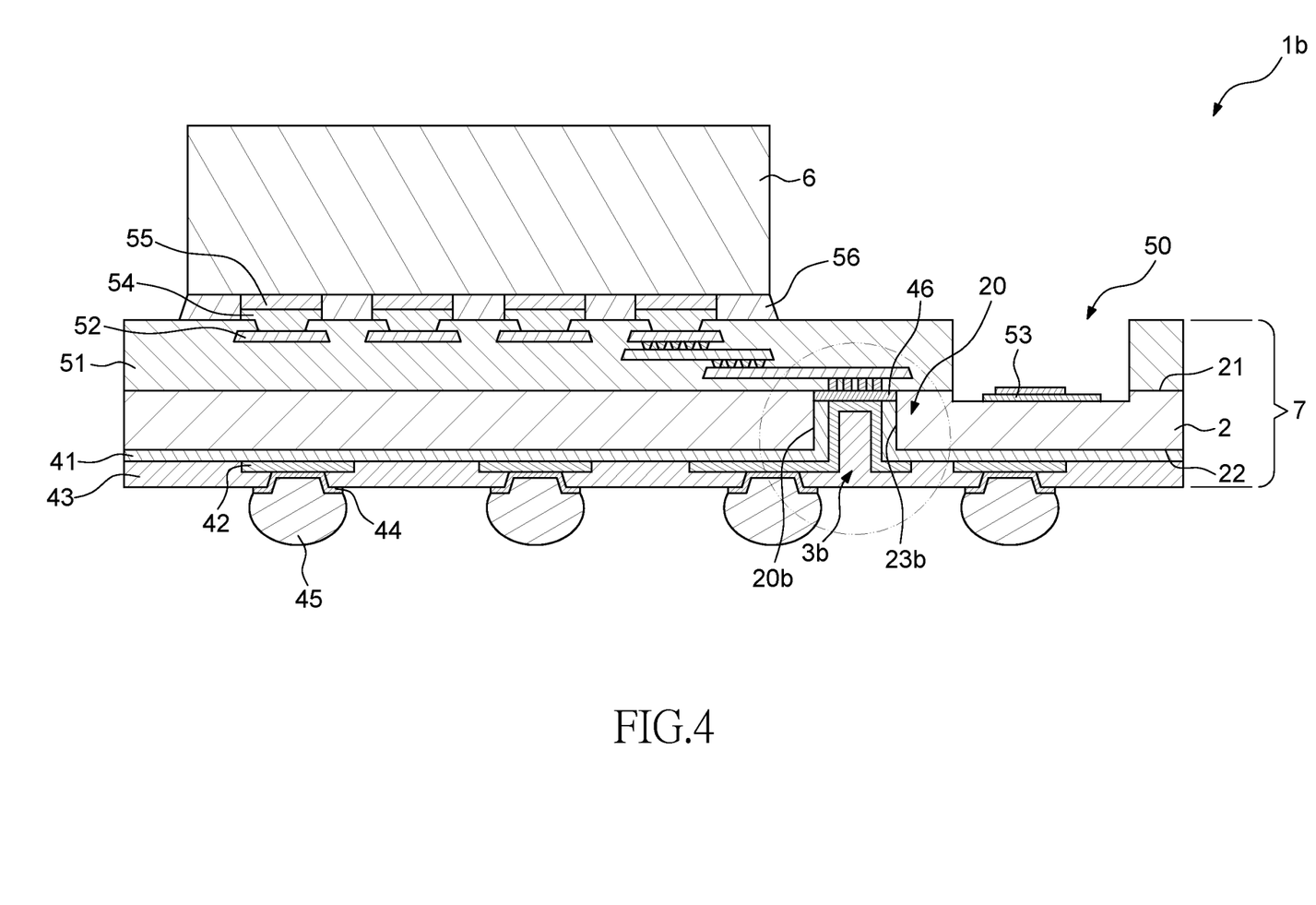
FIG. 4 illustrates a cross sectional view of a semiconductor package according to some embodiments of the present disclosure.
Figure 5:
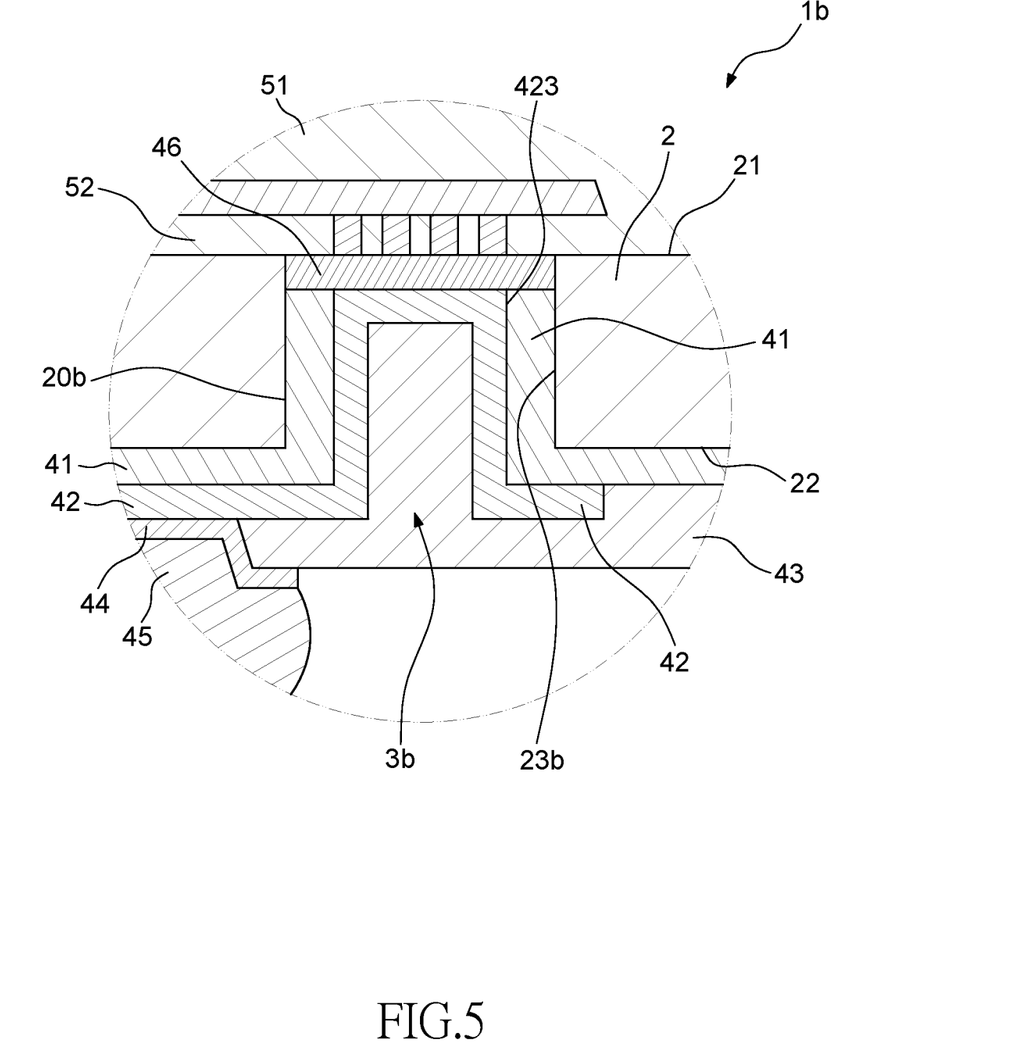
FIG. 5 illustrates an enlarged view of the semiconductor package shown in FIG. 4.

FIG. 4 illustrates a cross section view of a semiconductor package 1b according to some embodiments of the present disclosure. FIG. 5 illustrates an enlarged view of the semiconductor package 1b. The semiconductor package 1b is similar to the semiconductor package 1 shown in FIG. 1, except for the follows.

The semiconductor substrate 2 of the semiconductor package 1b also has an inner wall 23b defining a through hole 20b. However, as shown in FIGS. 4 and 5, the inner wall 23b may not be in a stair shape. Instead, the inner wall 23b may be substantially straight and continuous. The semiconductor package 1b further includes a second conductive layer 46 disposed in the through hole 20b and adjacent to the first surface 21 of the semiconductor substrate 2. The second conductive layer 46 may be disposed on and contacts to the circuit structure. The second conductive layer 46 may contact the inner wall 23b of the first die. The second conductive layer 46 may enclose an end of the through hole 20 adjacent to the first surface 21 of the semiconductor substrate 2.

The first dielectric layer 41 is disposed in the through hole 20a and on the inner wall 23b of the semiconductor substrate 2. The first conductive layer 42 is disposed on the first dielectric layer 41 and electrically connected to the second conductive layer 46. The first conductive layer 42 is electrically connected to the circuit structure through the second conductive layer 46. For example, the first conductive layer 42 has a first portion disposed on the first dielectric layer 41, and a second portion disposed on the second conductive layer 46.

That is, the through via 3b of the semiconductor package 1b includes the second conductive layer 46, the first dielectric layer 41 and the first conductive layer 42. In some embodiments, the through via 3b may further include the second dielectric layer 43.

In the semiconductor package 1b, due to the arrangement of the second conductive layer 46, the insulation layer 51 of the circuit structure and the first dielectric layer 41 are separated by the second conductive layer 46. The first dielectric layer 41 does not contact the insulation layer 51. Hence, there is no junction between the insulation layer 51 the semiconductor substrate 2 and the dielectric layer 41, and CTE mismatch can be alleviated. Cracks at such junction can thus be avoided.

Figure 6:
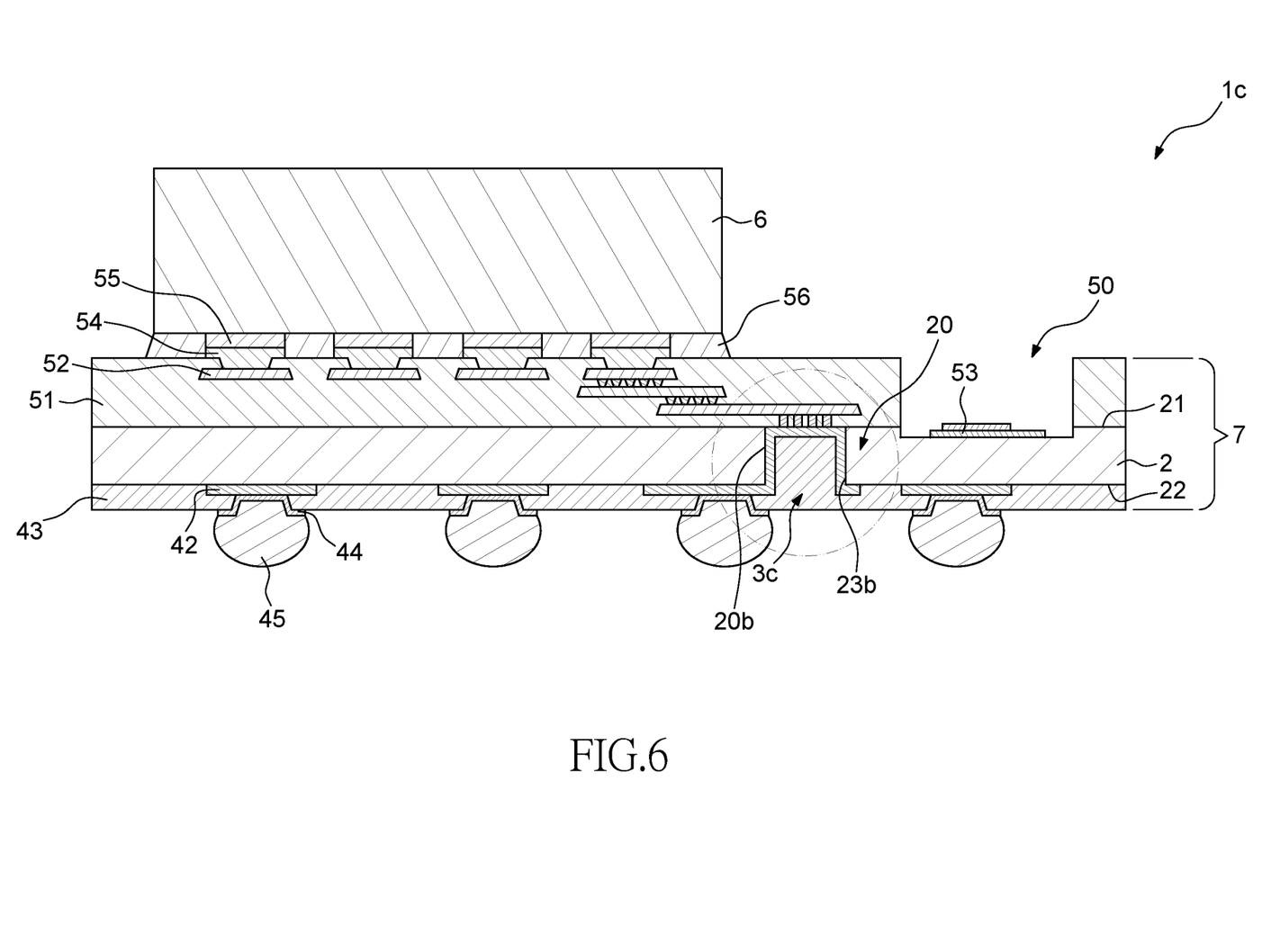
FIG. 6 illustrates a cross sectional view of a semiconductor package according to some embodiments of the present disclosure.
Figure 7:
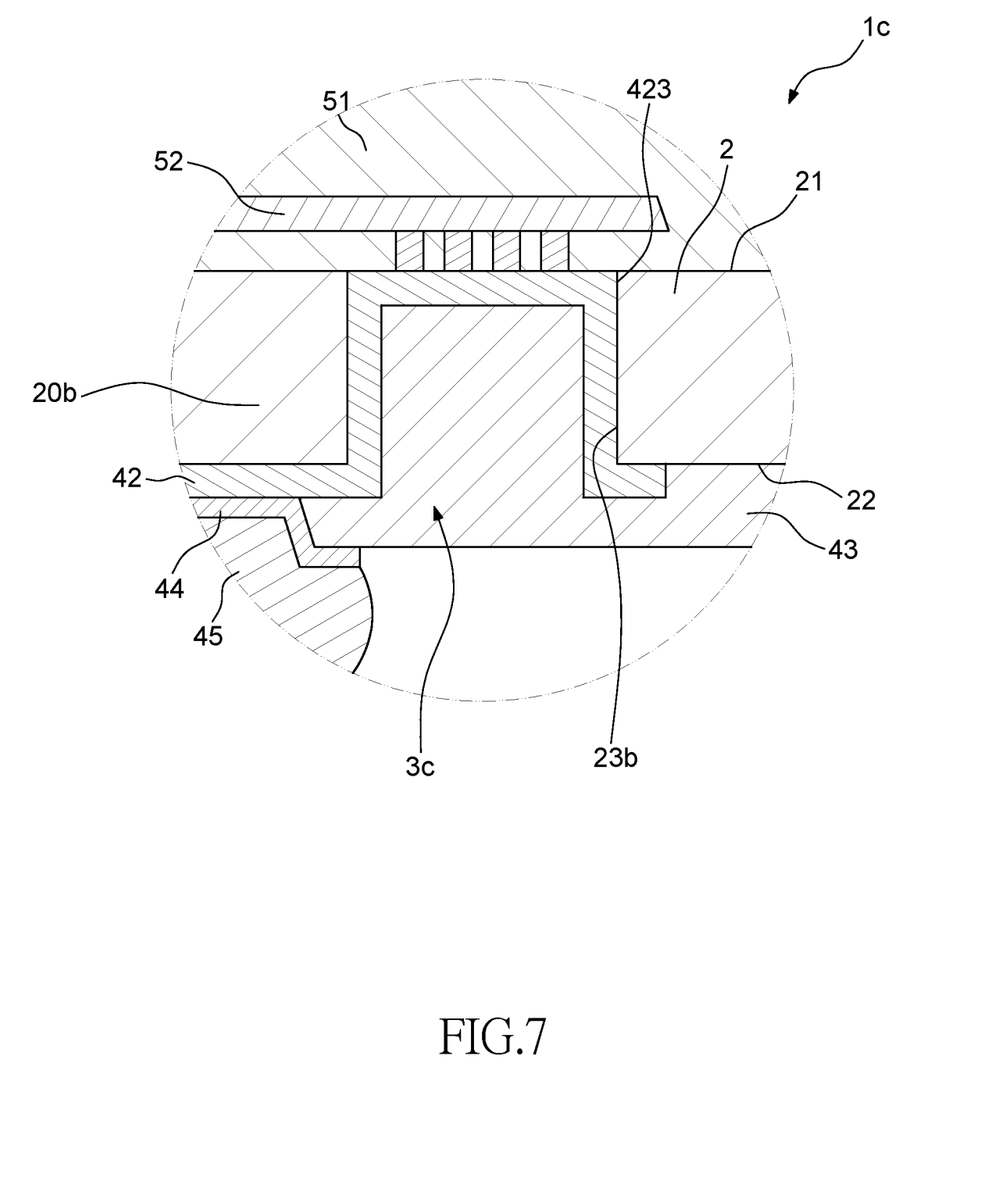
FIG. 7 illustrates an enlarged view of the semiconductor package shown in FIG. 6.

FIG. 6 illustrates a cross section view of a semiconductor package 1c according to some embodiments of the present disclosure. FIG. 7 illustrates an enlarged view of the semiconductor package 1c. The semiconductor package 1b is similar to the semiconductor package 1b shown in FIGS. 4 and 5, except that the second conductive layer 46 and the first dielectric layer 41 are omitted. Hence, the first conductive layer 42 is directly disposed on and contacts the circuit structure and the inner wall 23b.

That is, the through via 3c of the semiconductor package 1c includes a first conductive layer 42 disposed in the through hole 20b and contacts the inner wall 23b of the semiconductor substrate 2. In some embodiments, the through via 3a may further include the second dielectric layer 43.

In the semiconductor package 1c, since the first dielectric layer 41 is omitted, there is no junction between the insulation layer 51 the semiconductor substrate 2 and the dielectric layer 41. CTE mismatch can be alleviated, and cracks at such junction can thus be avoided.

FIG. 8 through FIG. 12 illustrate a method for manufacturing a semiconductor package according to some embodiments of the present disclosure. In some embodiments, the method is for manufacturing the semiconductor package 1 shown in FIGS. 1 and 2.

Figure 8:
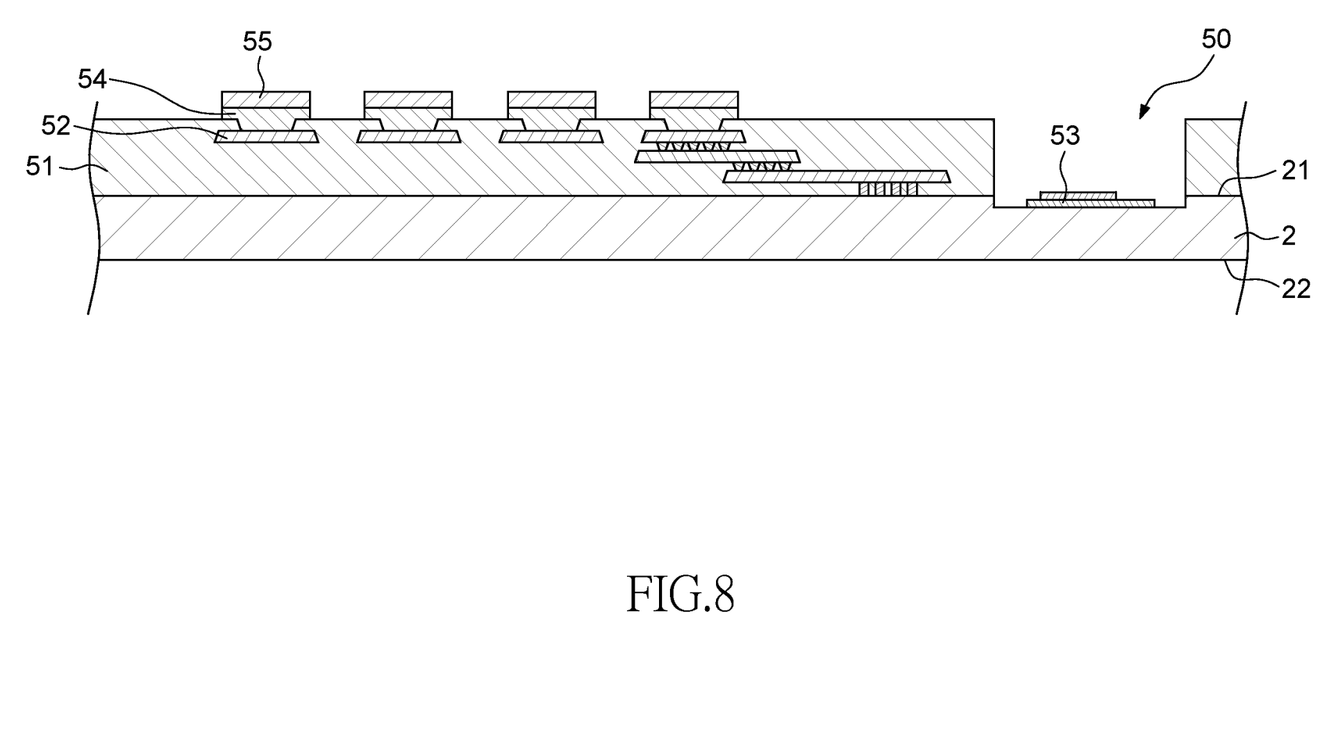
FIG. 8 illustrates one or more stages of an example of a method for manufacturing a semiconductor package according to some embodiments of the present disclosure.

Referring to FIG. 8, a semiconductor substrate 2 is provided, and a circuit structure (e.g., including an insulation layer 51 and a circuit layer 52) is disposed thereon. The semiconductor substrate 2 may be provided in a wafer. The semiconductor substrate 2 has a first surface 21 and a second surface 22 opposite to the first surface 21. The circuit structure includes an insulation layer 51 and a circuit layer 52. The circuit structure is disposed on the first surface 21 of the semiconductor substrate 2. The insulation layer 51 may define a trench 50 for positioning an optical component, such as a laser source or an optical fiber. For example, an adhesive 53 may be disposed in the trench for adhering the optical component. A conductive bump 55 and a solder 54 are sequentially disposed on the circuit layer 52 of the circuit structure.

Figure 9:
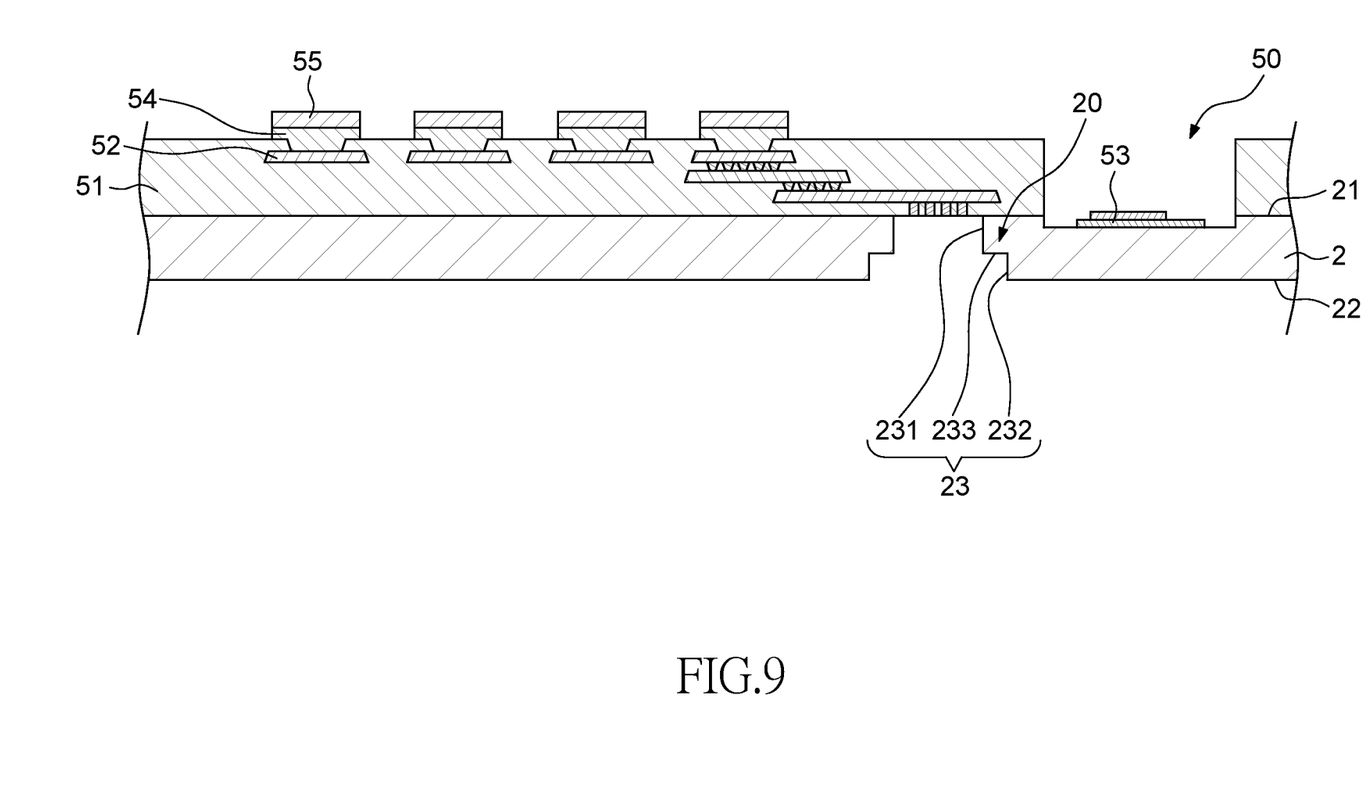
FIG. 9 illustrates one or more stages of an example of a method for manufacturing a semiconductor package according to some embodiments of the present disclosure.

Referring to FIG. 9, a through hole 20 is formed on and extends through the semiconductor substrate 2. Correspondingly, the semiconductor substrate 2 has an inner wall 23 defining the through hole 20. The inner wall 23 of the semiconductor substrate 2 is in a stair shape. The inner wall 23 has a first portion 231, a second portion 232 and a third portion 233. The first portion 231, the second portion 232 and the third portion 233 are located between the first surface 21 and the second surface 22 of the semiconductor substrate 2. The first portion 231, the second portion 232 and the third portion 233 are not continuous with each other. The first portion 231 is closer to the first surface 21 than the second portion 232 is. For example, the first portion 231 is connected to the first surface 21, and the second portion 232 is connected to the second surface 22. The third portion 233 is connected between the first portion 231 and the second portion 232. The first portion 231 and the second portion 232 may be substantially perpendicular to the first surface 21 of the semiconductor substrate 2.

The through hole 20 may be formed by any known techniques. For example, the through hole 20 may be formed by etching. In some embodiments, formation of the through hole 20 may include forming a straight hole corresponding to the first portion 231 of the inner wall 23. Then, a portion of the semiconductor substrate 2 surrounding the straight hole and adjacent to the second surface 22 of the semiconductor substrate 2 is further removed to form the second portion 232 and the third portion 233 of the inner wall 23, thus forming the stair-shaped through hole 20. In some other embodiments, the formation of the through hole 20 may include forming an opening corresponding to the second portion 232 and the third portion 233 of the inner wall 23. The opening does not extend through the semiconductor substrate 2. Then, a portion of the semiconductor substrate 2 adjacent to the first surface 21 is removed to form the first portion 231 of the inner wall 23, thus forming the stair-shaped through hole 20.

Figure 10:
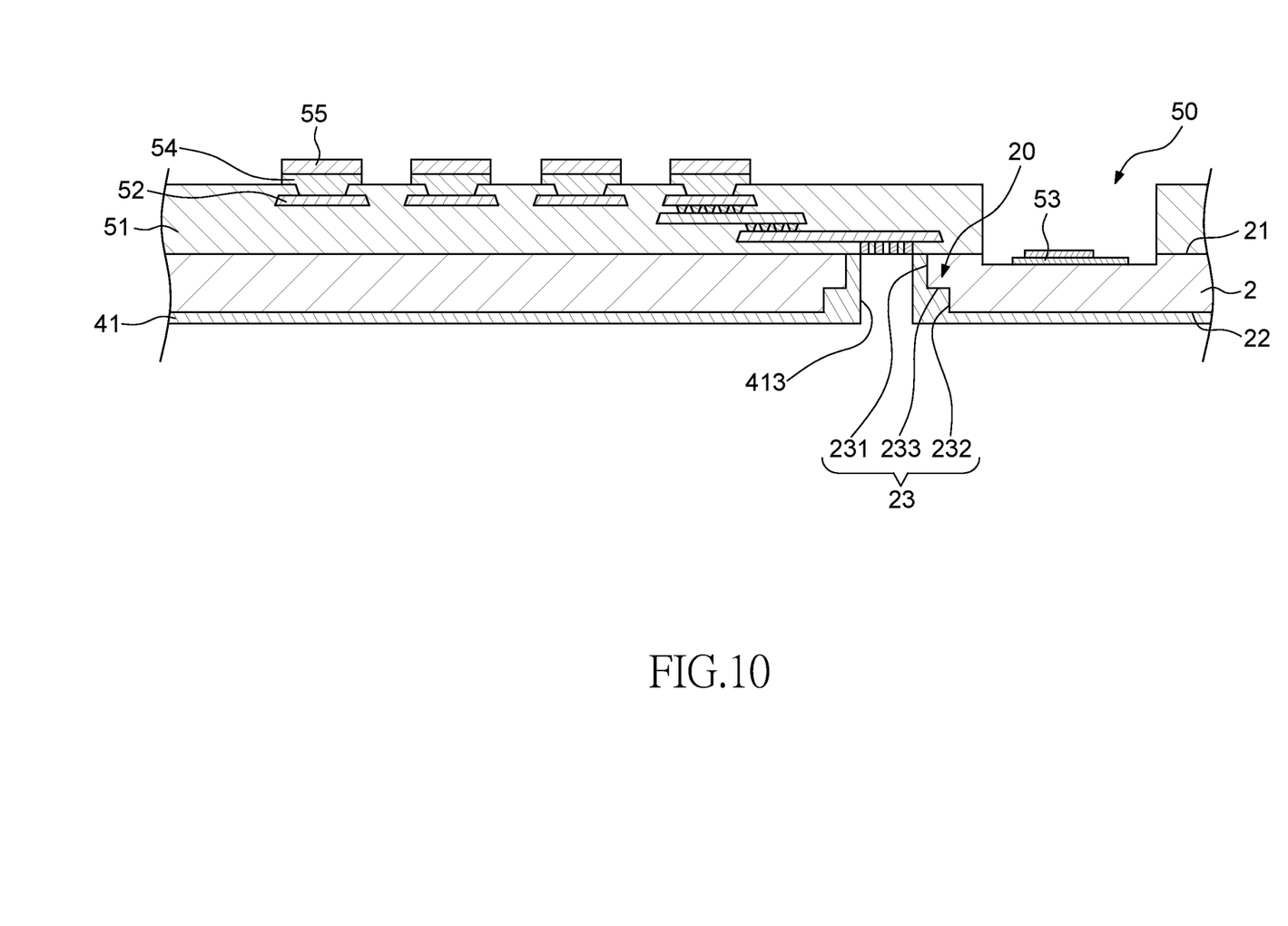
FIG. 10 illustrates one or more stages of an example of a method for manufacturing a semiconductor package according to some embodiments of the present disclosure.

Referring to FIG. 10, a first dielectric layer 41 is formed or disposed on the second surface 22 of the semiconductor substrate 2. A portion of the first dielectric layer 41 extends into the through hole 20. Then, a part of the portion of the first dielectric layer 41 is removed to expose a portion of the circuit structure. Correspondingly, the portion of the first dielectric layer 41 has an inner wall 413 in the through hole 20 of the semiconductor substrate 2. The inner wall 413 may be substantially straight and continuous.

Figure 11:
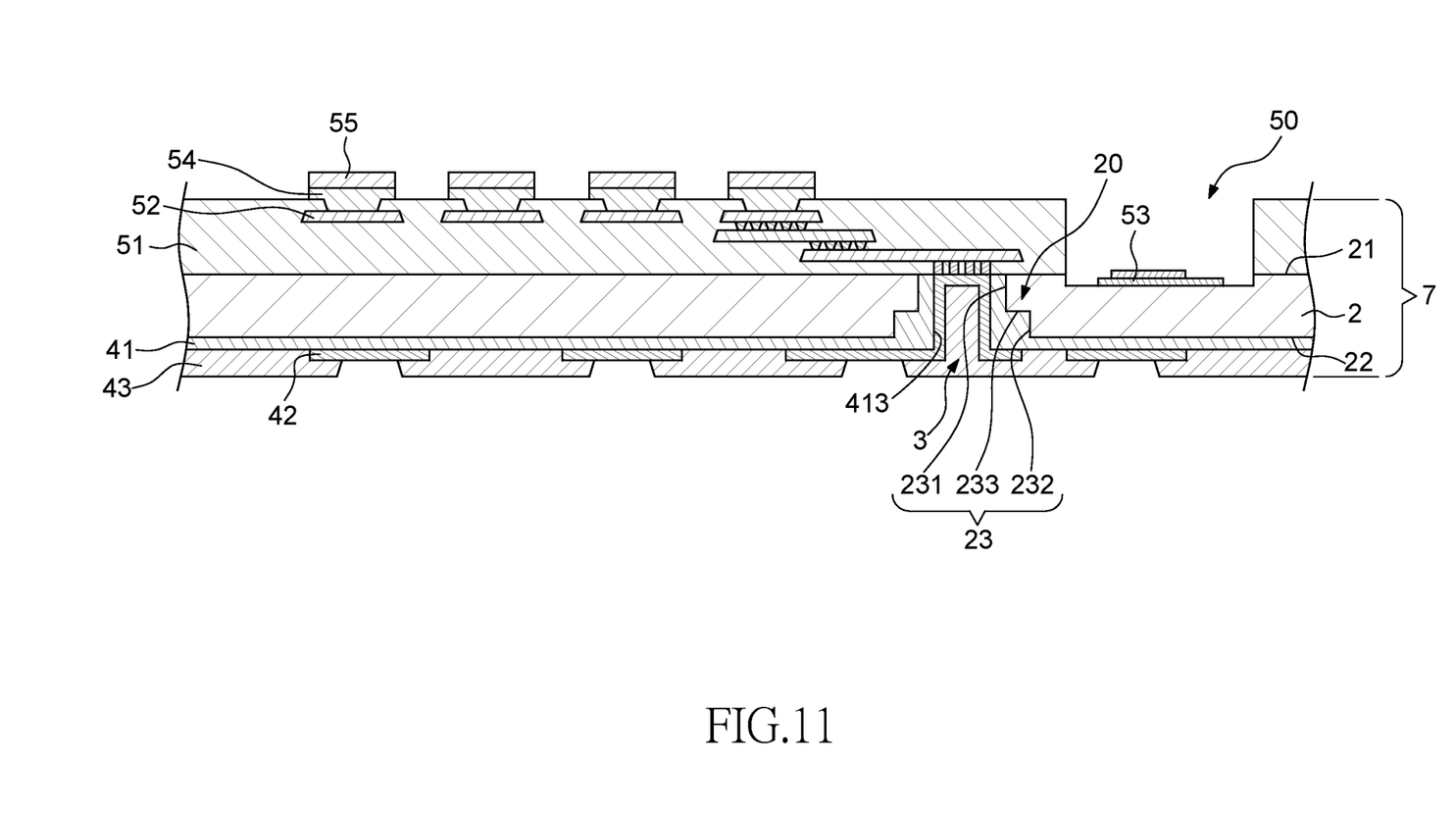
FIG. 11 illustrates one or more stages of an example of a method for manufacturing a semiconductor package according to some embodiments of the present disclosure.

Referring to FIG. 11, a first conductive layer 42 is formed on the first dielectric layer 41. A portion of the first conductive layer 42 extends into the through hole 20 of the semiconductor substrate 2, and is disposed on the inner wall 413 of the first dielectric layer 41. The first conductive layer 42 contacts the exposed portion of the circuit structure in the through hole 20, and is thus electrically connected to the circuit structure. Then, a second dielectric layer 43 is disposed on and covers the first dielectric layer 41 and the first conductive layer 42, thus forming a first die 7. A portion of the second dielectric layer 43 extends into the through hole 20. The portion of the first dielectric layer 41, the portion of the first conductive layer 42 and the portion of the second dielectric layer 43 jointly form a through via 3. The through via 3 is electrically connected to the circuit structure. The second dielectric layer 43 exposes at least a portion of the first conductive layer 42.

Figure 12:
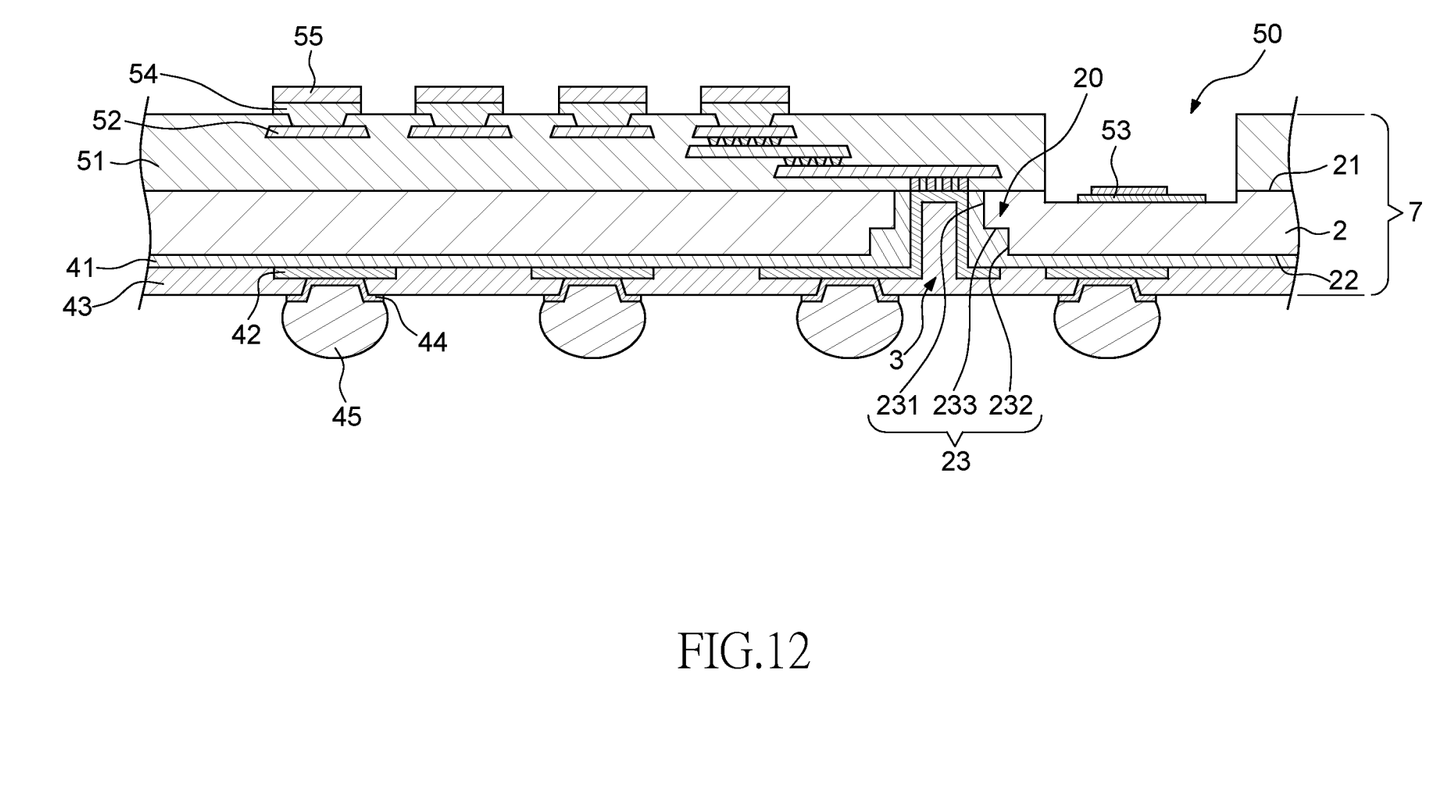
FIG. 12 illustrates one or more stages of an example of a method for manufacturing a semiconductor package according to some embodiments of the present disclosure.

Referring to FIG. 12, a UBM 44 and an external connector 45 are sequentially formed or disposed on the exposed portion of the first conductive layer 42. Then, a second die 6 is disposed on and electrically connected to the circuit structure. The second die 6 contacts the solder 54, and is electrically connected to the through via 3 through the conductive bump 55, the solder 54 and the circuit layer 52 of the circuit structure. An underfill 56 is disposed between the second die 6 and the circuit structure, and covers and surrounds the conductive bump 55 and the solder 54. In some embodiments, the second die 2 may be connected to the circuit structure before forming or disposing the UBM 44 and the external connecter 45. Then, a singulation process is conducted to the semiconductor substrate 2 (or the wafer including the semiconductor substrate 2), the first dielectric layer 41, the first conductive layer 42 and the second dielectric layer 43, thus forming the semiconductor package 1 as shown in FIG. 1.

In the semiconductor package of the present disclosure, due to a length of a first lever arm less than a thickness of a first die and/or the arrangement of a first raiser in the semiconductor package, cracks at a junction between the die, a through via and an insulation layer of a circuit structure may be eliminated or avoided.

Spatial descriptions, such as "above," "below," "up," "left," "right," "down," "top," "bottom," "vertical," "horizontal," "side," "higher," "lower," "upper," "over," "under," and so forth, are indicated with respect to the orientation shown in the figures unless otherwise specified. It should be understood that the spatial descriptions used herein are for purposes of illustration only, and that practical implementations of the structures described herein can be spatially arranged in any orientation or manner, provided that the merits of embodiments of this disclosure are not deviated from by such an arrangement.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, two numerical values can be deemed to be "substantially" the same or equal if a difference between the values is less than or equal to ±10% of an average of the values, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%.

Two surfaces can be deemed to be coplanar or substantially coplanar if a displacement between the two surfaces is no greater than 5 μm, no greater than 2 μm, no greater than 1 μm, or no greater than 0.5 μm.

As used herein, the singular terms "a," "an," and "the" may include plural referents unless the context clearly dictates otherwise.

As used herein, the terms "conductive," "electrically conductive" and "electrical conductivity" refer to an ability to transport an electric current. Electrically conductive materials typically indicate those materials that exhibit little or no opposition to the flow of an electric current. One measure of electrical conductivity is Siemens per meter (S/m). Typically, an electrically conductive material is one having a conductivity greater than approximately $10^4$ S/m, such as at least $10^5$ S/m or at least $10^6$ S/m. The electrical conductivity of a material can sometimes vary with temperature. Unless otherwise specified, the electrical conductivity of a material is measured at room temperature.

Additionally, amounts, ratios, and other numerical values are sometimes presented herein in a range format. It is to be understood that such range format is used for convenience and brevity and should be understood flexibly to include numerical values explicitly specified as limits of a range, but also to include all individual numerical values or sub-ranges encompassed within that range as if each numerical value and sub-range is explicitly specified.

While the present disclosure has been described and illustrated with reference to specific embodiments thereof, these descriptions and illustrations are not limiting. It should be understood by those skilled in the art that various changes may be made and equivalents may be substituted without departing from the true spirit and scope of the present disclosure as defined by the appended claims. The illustrations may not be necessarily drawn to scale. There may be distinctions between the artistic renditions in the present disclosure and the actual apparatus due to manufacturing processes and tolerances. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations of the present disclosure.

What is claimed is:

1. A semiconductor package, comprising:
a first die comprising a semiconductor substrate, wherein the semiconductor substrate has a first surface, a second surface opposite to the first surface, and a through hole between the first surface and the second surface and having an inner wall, the inner wall has a first lever arm, and a length of the first lever arm is less than a thickness of the semiconductor substrate; and
a first dielectric layer disposed within the through hole and defining a substantially straight sidewall extending from the first surface to the second surface of the semiconductor substrate,
wherein the first surface of the semiconductor substrate is not covered by the first dielectric layer, and a top surface of the first dielectric layer is substantially level with the first surface of the semiconductor substrate.

2. The semiconductor package of claim 1, wherein the first dielectric layer covers the second surface of the semiconductor substrate.

3. The semiconductor package of claim 1, further comprising:
a conductive layer disposed on the first dielectric layer, wherein the top surface of first dielectric layer is not covered by the semiconductor substrate and the conductive layer.

4. The semiconductor package of claim 3, wherein a top surface of the conductive layer is substantially level with the top surface of the first dielectric layer.

5. The semiconductor package of claim 1, further comprising:
a conductive layer disposed on the substantially straight sidewall of the first dielectric layer and completely penetrating the semiconductor substrate.

6. The semiconductor package of claim 5, wherein the conductive layer has a substantially uniform thickness from the first surface of the semiconductor substrate to the second surface of the semiconductor substrate.

7. The semiconductor package of claim 6, wherein the conductive layer defines a blind hole recessed from the second surface of the semiconductor substrate into the first lever arm of the inner wall.

8. The semiconductor package of claim 7, further comprising:
a second dielectric layer filling the blind hole defined by the conductive layer.

9. The semiconductor package of claim 8, wherein the second dielectric layer covers the second surface of the semiconductor substrate.

10. A semiconductor package, comprising:
a first die comprising a semiconductor substrate, wherein the semiconductor substrate has a first surface, a second surface opposite to the first surface, and a through hole between the first surface and the second surface and having an inner wall, the inner wall has a first lever arm, and a length of the first lever arm is less than a thickness of the semiconductor substrate; and
a first dielectric layer disposed within the through hole and defining a substantially straight sidewall extending from the first surface to the second surface of the semiconductor substrate, wherein the substantially straight sidewall of the first dielectric layer completely penetrates the semiconductor substrate, the substantially straight sidewall of the first dielectric layer is spaced apart from the inner wall, the substantially straight sidewall and the inner wall define a step shape with a first portion and a second portion of the first dielectric layer, the second portion is more adjacent to an external connector than the first portion is, and the second portion is wider than the first portion is.

11. The semiconductor package of claim 10, wherein a length of the second portion is greater than a length of the first portion.

12. The semiconductor package of claim 11, further comprising:
a conductive layer disposed on and contacting the substantially straight sidewall of the first dielectric layer.

13. The semiconductor package of claim 10, further comprising:
a conductive layer disposed on the substantially straight sidewall of the first dielectric layer and completely penetrating the semiconductor substrate; and
a second dielectric layer disposed within the through hole, wherein the second dielectric layer extends from a level of the second surface of the semiconductor substrate into the first lever arm of the inner wall, wherein
the substantially straight sidewall of the first dielectric layer completely penetrates the semiconductor substrate,
the first surface of the semiconductor substrate is not covered by the first dielectric layer, and
the inner wall is slanted with respect to the first surface of the semiconductor substrate.

14. A semiconductor package, comprising:
a first die comprising a semiconductor substrate, wherein the semiconductor substrate has a first surface, a second surface opposite to the first surface, and a through hole between the first surface and the second surface and having an inner wall, the inner wall has a first lever arm, and a length of the first lever arm is less than a thickness of the semiconductor substrate;
a first dielectric layer disposed within the through hole and defining a substantially straight sidewall extending from the first surface to the second surface of the semiconductor substrate; and
a second dielectric layer disposed within the through hole, wherein the second dielectric layer extends from a level of the second surface of the semiconductor substrate into the first lever arm of the inner wall.

15. The semiconductor package of claim 14, wherein the second dielectric layer is spaced apart from the first dielectric layer by a conductive layer.

16. The semiconductor package of claim 15, wherein a top surface of the conductive layer is exposed from a top surface of the first dielectric layer, a top surface of the second dielectric layer, and the first surface of the semiconductor substrate.

17. The semiconductor package of claim 14, wherein the inner wall is slanted with respect to the first surface of the semiconductor substrate.

\* \* \* \* \*